(12) United States Patent
E. Horch

(10) Patent No.: US 8,501,562 B1
(45) Date of Patent: Aug. 6, 2013

(54) FABRICATING A GATE OXIDE

(75) Inventor: Andrew E. Horch, Seattle, WA (US)

(73) Assignee: Synopsys, Inc., Mountain View, CA (US)

( * ) Notice: Subject to any disclaimer, the term of this patent is extended or adjusted under 35 U.S.C. 154(b) by 297 days.

(21) Appl. No.: 12/717,966

(22) Filed: Mar. 5, 2010

(51) Int. Cl.
- *H01L 21/8242* (2006.01)
- *H01L 21/336* (2006.01)
- *H01L 21/76* (2006.01)

(52) U.S. Cl.
USPC ........... 438/248; 438/296; 438/424; 438/435; 257/E21.691; 257/E29.129

(58) Field of Classification Search
USPC . 438/248, 296, 424, 435, 257; 257/E29.129, 257/E21.694
See application file for complete search history.

(56) References Cited

U.S. PATENT DOCUMENTS 4,587,432 A  5/1986 Aitken
5,854,114 A * 12/1998 Li et al. .......... 438/296

OTHER PUBLICATIONS

S. Wolf, "Silicon Processing for the VLSI Era vol. 2—Process Integration", 1990, p. 27, Lattice Press.
M. Depas, T. Nigam and M. Hayes, "Soft Breakdown of Ultra-Thin Gate Oxide Layers", Sep. 1996, vol. 43, No. 9, IEEE Transaction on Electron Devices.

\* cited by examiner

*Primary Examiner* — David S Blum
(74) *Attorney, Agent, or Firm* — Evergreen Valley Law Group, P.C.; Kanika Radhakrishnan

(57) ABSTRACT

An example of a method of fabricating a gate oxide of a floating gate transistor includes forming a plurality of shallow trench isolation (STI) regions in a silicon wafer. The method also includes selectively filling the STI regions with oxide. Further, the method includes forming sacrificial oxide regions on the silicon wafer. Furthermore, the method includes forming implant regions in the silicon wafer. In addition, the method includes selectively removing the sacrificial oxide regions. The method further includes forming the gate oxide.

19 Claims, 7 Drawing Sheets

FABRICATING A GATE OXIDE

FIELD

The present disclosure generally relates to a manufacturing process for integrated circuits, and more particularly, relates to a method for fabricating gate oxide in metal oxide semiconductor (MOS) devices used in non-volatile memory (NVM) devices.

BACKGROUND

In standard logic complementary metal oxide semiconductor (CMOS) process, transistors fabricated have gate oxides that enable non-volatile memory (NVM) to retain charge on a floating gate. The thinnest silicon dioxide gate oxide that can be used to retain charge on the floating gate is around 50 Angstrom (A). A 50 A gate oxide is typically used for a 2.5V device in the standard logic CMOS process. Currently, the NVM charge retention time is 10 years. However, when the 50 A gate oxide is scaled below 50 A the charge retention time is reduced below 10 years due to direct tunneling.

Standard logic CMOS processes typically have two or more gate oxide thicknesses. One oxide thickness is used for core logic devices and a second thicker oxide is used for Input/Output (I/O) of the chip. I/O voltage typically needs to be large since it is driving very long chip to chip interconnects. Typically, an I/O device is operable at 2.5V or higher. However, as technology continues to scale to smaller devices and lower voltages, the I/O devices also need to be scaled to smaller dimensions and smaller voltages. When the I/O devices are scaled down to 1.8V (the next step below 2.5V), floating gate NVM having standard 10 year retention is no longer possible.

Further, the charge retention time for devices that support 1.8V is less than 1 year. Hence to increase the charge retention time, ideally another gate oxide can be added by thermal oxidation to create thicker gate oxide. However, growing another gate oxide by thermal oxidation adds a lot of heat to the process. Deep sub-micron processes are sensitive to heat and the additional heat causes dopants in the semiconductor material to diffuse. In many processes the additional diffusion affect the performance of the other devices, which is not acceptable. There is a need for a method to solve the above mentioned problems.

SUMMARY

An example of a method of fabricating a gate oxide of a floating gate transistor includes forming a plurality of shallow trench isolation (STI) regions in a silicon wafer. The method also includes selectively filling the STI regions with oxide. Further, the method includes forming sacrificial oxide regions on the silicon wafer. Furthermore, the method includes forming implant regions in the silicon wafer. In addition, the method includes selectively removing the sacrificial oxide regions. The method further includes forming the gate oxide.

An example of a method of fabricating a gate oxide of a transistor includes forming a plurality of shallow trench isolation (STI) regions in a silicon wafer by at least one of depositing an oxide layer, depositing a nitride layer, developing a photo resist, etching the oxide layer, etching the nitride layer, and etching the silicon wafer. The method includes selectively filling the STI regions with oxide by at least one of removing the photo resist, and filling the STI regions with the oxide up to the nitride layer. Further, the method includes forming sacrificial oxide regions in the silicon wafer. The method also includes forming implant regions in the silicon wafer by at least one of developing n-well regions, developing p-well regions, removing nitride, and selectively removing the oxide. The method includes selectively removing the sacrificial oxide regions. Further, the method includes forming the gate oxide.

An example of a transistor prepared by a process includes forming a plurality of shallow trench isolation (STI) regions in a silicon wafer by at least one of depositing an oxide layer, depositing a nitride layer, developing a photo resist, etching the oxide layer, etching the nitride layer, and etching the silicon wafer. Further, the process includes selectively filling the STI regions with oxide by at least one of removing the photo resist, and filling the STI regions with the oxide up to the nitride layer. The process also includes forming sacrificial oxide regions in the silicon wafer. Further, the process includes forming implant regions in the silicon wafer by at least one of developing n-well regions, developing p-well regions, removing nitride, and selectively removing the oxide. The process includes selectively removing the sacrificial oxide regions. Further, the process includes forming a gate oxide.

DETAILED DESCRIPTION OF THE EMBODIMENTS

Non-volatile memory cells make use of floating gate transistors to store information even when power is turned off. The retention of stored information is dependent on thickness and quality of gate oxide of a floating gate transistor.

A Floating Gate MOSFET (FGMOS) is a field effect transistor. Structure of the floating gate transistor is similar to a conventional MOSFET. The gate of the FGMOS is electrically isolated, creating a floating node in DC, and a number of secondary gates or inputs or interconnect layers are deposited above the floating gate (FG) and are electrically isolated from it. These inputs are only capacitively connected to the FG. Since the FG is completely surrounded by highly resistive material, the charge contained in it remains unchanged for long periods of time. Fowler-Nordheim Tunneling and Hot-Carrier Injection mechanisms are used in order to modify the amount of charge stored in the FG. The contents of the FGMOS device are read capacitively as well.

Some applications of the FGMOS are digital storage element in erasable programmable read only memory (EPROM), Electrically Erasable Programmable Read-Only Memory (EEPROM) and FLASH memories, neuronal computational element in neural networks, analog storage element, e-Pots and single-transistor digital-to-analog converters (DACs). The FGMOS with thin gate oxides may induce leakage currents in the FGMOS. The leakage current prevents FGMOS from storing charge for any significant period of time. Hence, to avoid leakage current thick gate oxides are used in FGMOS.

The method of fabricating a thick gate oxide in the FGMOS is further explained in conjunction with FIG. 1A to FIG. 1J.

FIG. 1A to FIG. 1J are exemplarily illustrations of various steps involved in fabricating a gate oxide of the floating gate transistor (FGMOS).

Figure 1B:
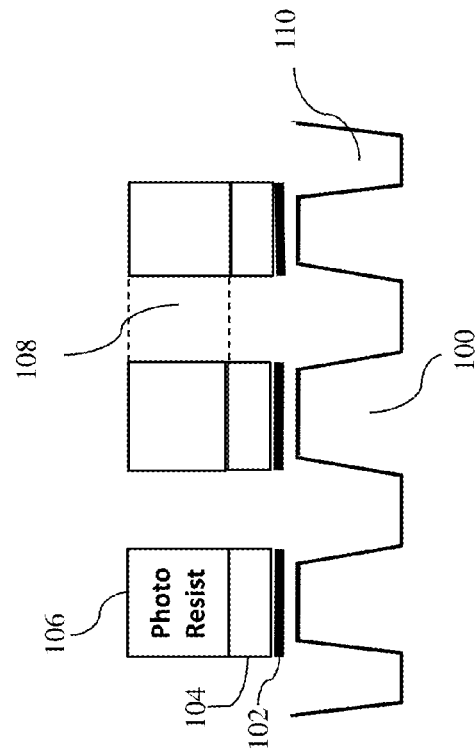
FIG. 1A to FIG. 1J are exemplarily illustrations of various steps involved in fabricating a gate oxide of a floating gate transistor in accordance with one embodiment.
Figure 1A:
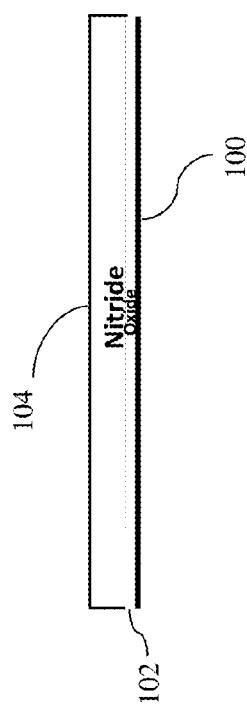

FIG. 1A illustrates a step of forming a silicon wafer 100 and preparing shallow trench isolations (STI) in the silicon wafer 100. An oxide layer 102 and a nitride layer 104 are fabricated on the silicon wafer 100. The nitride layer 104 is used as chemical-mechanical polishing (CMP) stopping layer. The oxide layer 102 is grown or deposited on the silicon wafer 100. The nitride layer 104 is deposited on the oxide layer 102.

FIG. 1B illustrates a step of depositing one or more photo resists, for example a photo resist 106 on the nitride layer 104. The one or more photo resists, for example a photo resist 108, is selectively exposed and removed. The nitride layer 104, the oxide layer 102, and the silicon wafer 100 can be selectively etched to form Shallow Trench Isolation (STI), for example, an STI region 110 in the silicon wafer 100.

Figure 1D:
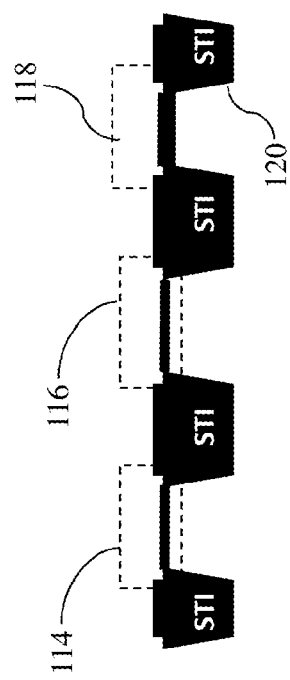
Figure 1C:
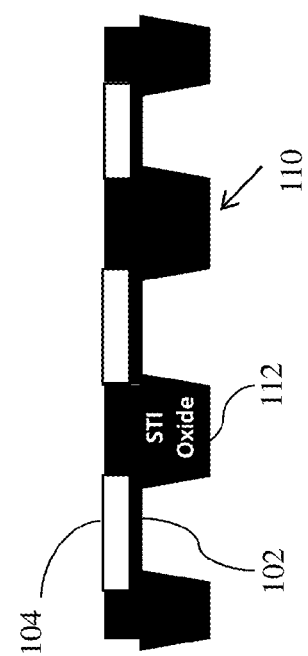

FIG. 1C illustrates a step of removing the one or more photo resist, for example the photo resist 106 and filling the one or more STI regions, for example the STI region 110, with oxides to form STI oxides, for example an STI oxide 112. The silicon wafer 100 is put through a Chemical Mechanical Polish (CMP) step to remove any excess oxide above the height of the nitride layer 104.

FIG. 1D illustrates a step of removing the nitride layer 104 and the oxide layer 102 from one or more regions, for example a region 114. Also, the oxide layer 102 is grown and stripped at one or more regions, for example a region 116 to eliminate Kooi effect. The Kooi effect refers to formation of a thin layer of silicon nitride on the silicon surface (i.e. at the pad-oxide/silicon interface) as a result of the reaction of NH3 and silicon at the interface. The Kooi effect is further described in "*Silicon Processing for the VLSI Era Volume 2—Process Integration*" S. Wolf Lattice Press, 1990, p. 27 and is incorporated herein by reference in its entirety. After any nitride at silicon surface due to Kooi effect is removed, a sacrificial layer is formed at one or more regions, for example a region 118. The region 114, the region 116, and the region 118 are used in standard logic CMOS processes as a sacrificial layer. The region 114, the region 116, and the region 118 are called sacrificial layers as they are completely removed later in the process. The sacrificial layer is primarily used to protect semiconductor surface during the steps between STI formation and gate oxide formation. Any contamination that accumulates on the semiconductor surface prior to gate oxide formation is removed with the sacrificial layer. The contamination that can occur during ion implantation and how the ion implant tools have improved to avoid the contamination is further described in U.S. Pat. No. 4,587,432 and titled "Apparatus for ion implantation", assigned to Applied Materials, Inc and is incorporated herein by reference in its entirety. The sacrificial oxide may have some random defects (contamination) on it. The random defect can be a problem from standard logic device. For non-volatile memory (NVM), Error Correction Codes (ECC) and differential bitcells can be used to make the NVM highly tolerant to the random defects. The NVM retention can be tested for as part of the standard manufacturing process. Thus some defects can be detected that could not be detected if the device is being used for standard logic.

Figure 1F:
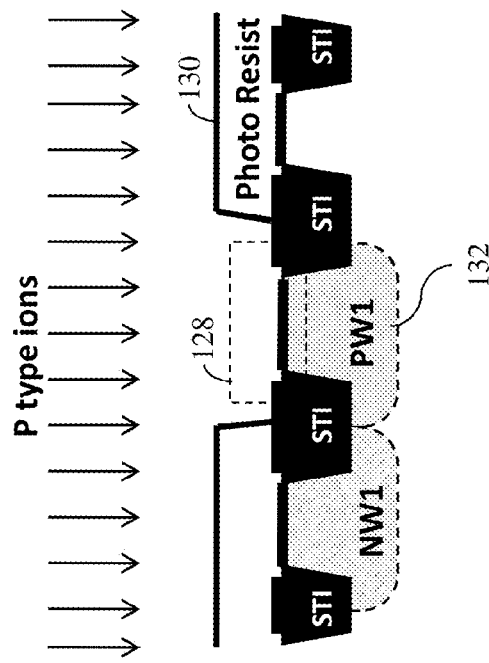
Figure 1E:
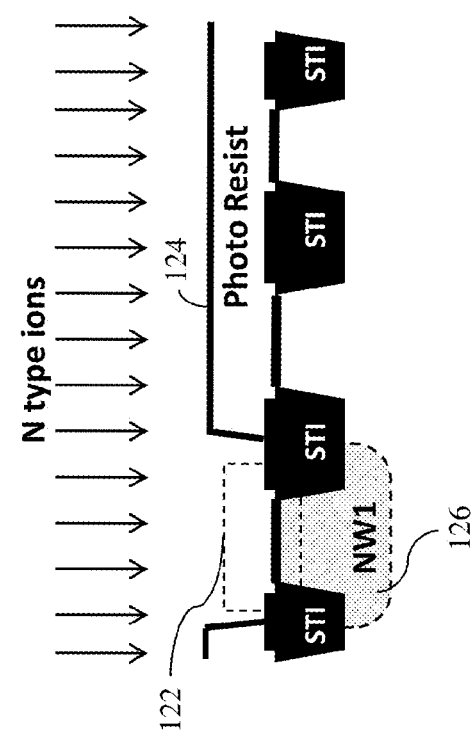

FIG. 1E illustrates a step of depositing, exposing, and selectively removing the photo resist at one or more regions, for example a region 122 and a region 124. Also, an ion implantation methodology is performed to form a first N-well region 126.

FIG. 1F illustrates a step of removing the photo resist at one or more regions, for example a region 128. The photo resist is developed, exposed or deposited at one or more regions, for example a region 130. Also, an ion implantation methodology is performed to form a first P-well region 132.

Figure 1G:
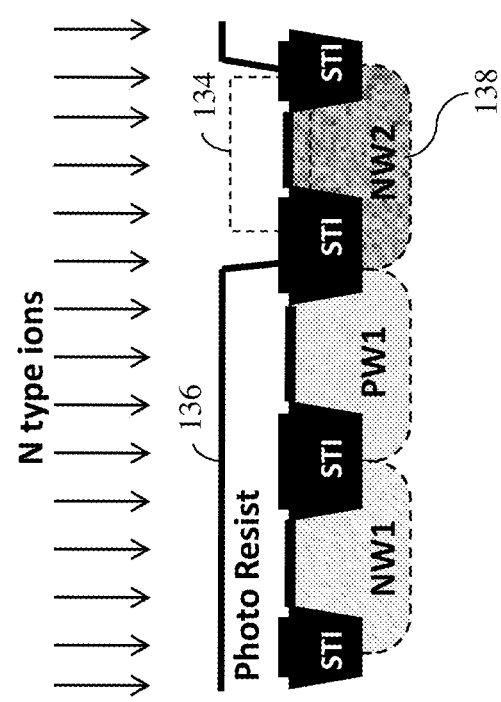

FIG. 1G illustrates a step of removing the photo resist at one or more regions, for example a region 134. The photo resist is developed, exposed or deposited at one or more regions, for example a region 136. Also, an ion implantation methodology is performed to form a second N-well region 138.

In some embodiments, additional ion implantation or annealing can be performed.

Figure 1I:
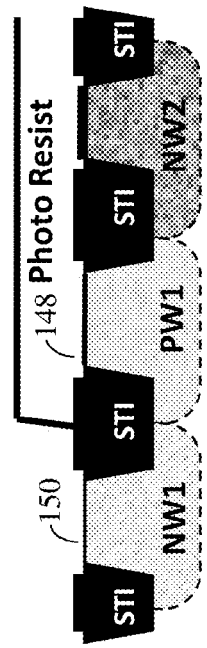
Figure 1H:
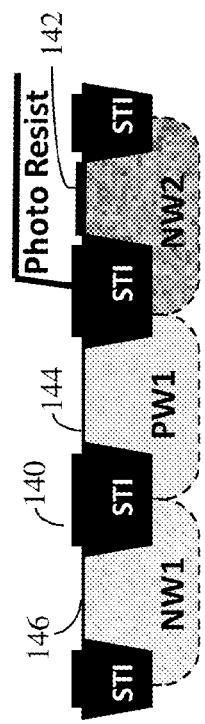

FIG. 1H illustrates a step of removing the photo resist at one or more regions, for example a region 140. The photo resist is developed, exposed or deposited at one or more regions, for example a region 142. Also, the sacrificial layer is removed at one or more regions, for example a region 144 and a region 146. In some embodiments, the sacrificial layer may be referred to as sac-ox.

FIG. 1I illustrates a step of removing the photo resist to form a second gate dielectric region at one or more regions, for example a region 148. The photo resist is developed, exposed or deposited at one or more regions and the gate dielectric region is removed from the one or more regions, for example a region 150.

Figure 1J:
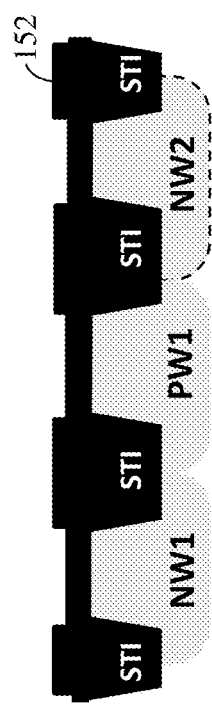

FIG. 1J illustrates a step of depositing a conductive gate material at one or more regions, for example a region 152. The conductive gate material can be poly silicon.

In one embodiment, the sacrificial region 118 goes through a number of process steps that a normal uncovered gate oxide does not go through, for example an ion implantation process step. In some embodiments, there is no ion implantation process step between a step when a gate dielectric region is formed and a step when a conductive gate material is deposited.

In another embodiment, a thick gate oxide with uniformly low quality is ideal for a one time programmable (OTP) memory. For a multiple time programmable (MTP) NVM the fabrication method might be modified to closely resemble the normal gate oxide fabrication method to give the desired quality for the NVM. In another embodiment, the thick oxide is used to reinforce an oxide that is at least partially formed with a high-k dielectric material.

In one aspect, a stack is formed by thermally growing a gate oxide or if high-k dielectric is used then depositing a high-k dielectric on top of a silicon wafer. The stack starts with a deposited or thermally grown Silicon dioxide (SiO2) and then more dielectric materials are grown or deposited on top of the silicon wafer. In another aspect, the sacrificial oxide layer is selectively removed prior to thermally growing the gate oxidation. The sacrificial oxide layer is distinguished for the normal gate oxide by having a number of process steps, for example ion implantation methodology in between oxide formation and conductive gate material deposition.

Figure 2:
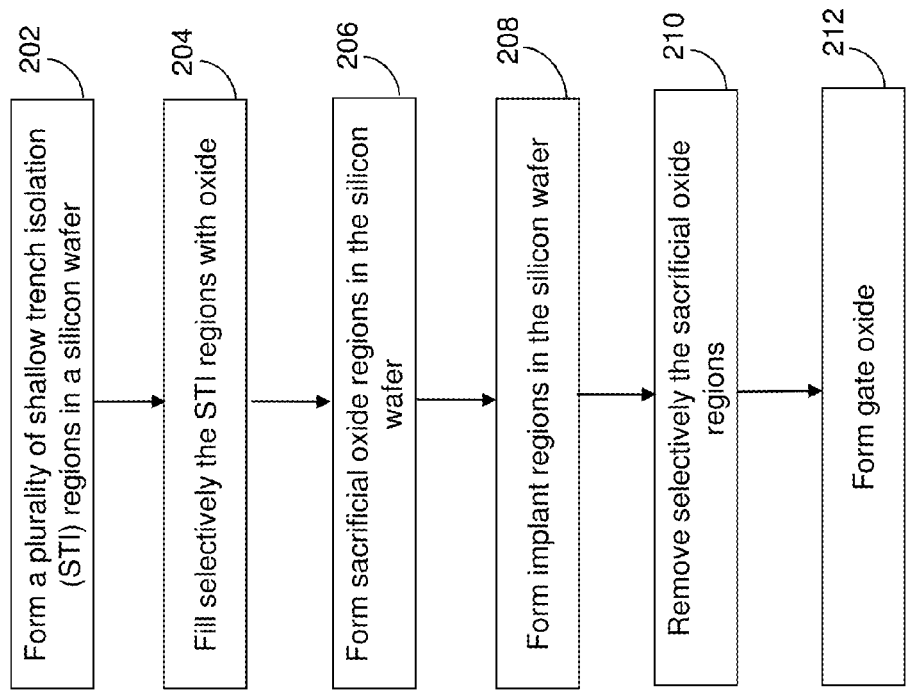
FIG. 2 illustrates a method of fabricating a gate oxide of a floating gate transistor in accordance with one embodiment.

FIG. 2 illustrates a method of fabricating a gate oxide of a floating gate transistor.

At step 202, a plurality of shallow trench isolation (STI) regions are formed (the STI region 110) in a silicon wafer (the silicon wafer 100). The STI region 110 may be formed by depositing an oxide layer, a nitride layer, developing a photo resist and etching the oxide layer, the nitride layer and the silicon wafers as illustrated in FIG. 1B.

In one embodiments, the shallow trench process for a standard logic CMOS 0.25 Micro meter (µm) process is as follows:

The oxide layer is around 500 Angstrom (A), the nitride layer on top of it is around 1500 A, and trench depth is 4000 A below the silicon surface.

In some embodiments, the thickness of the oxide and nitride layers as well as the trench depth is reduced.

At step 204, the STI regions are selectively filled with the oxide. The STI regions may be filled with the oxide, CMP is used to remove any extra oxide above the nitride layer. The nitride and some oxide are removed. Some oxide is removed to expose the semiconductor surface.

At step 206, sacrificial oxide regions are formed on the silicon wafer as illustrated in FIG. 1D.

At step 208, implant regions are formed in the silicon wafer. The implant regions in the silicon wafer are formed by developing N-wells (the first N-well region 126 and the second N-well region 138), developing P-well regions (the first N-well region 132), as illustrated in FIG. 1E to FIG. 1G.

At step 210, the sacrificial oxide regions are selectively removed as illustrated in FIG. 1H.

At step 212, gate oxide, also referred to as gate dielectrics (the region 114, the region 116, and the region 118) is formed.

In one embodiment, a gate dielectric having a first portion and a second portion is formed. Implantation is performed on the first portion without a material covering the first portion, and the second portion is free of implants.

In another embodiment, the gate dielectric having a first portion and a second portion is formed. The first portion is formed prior to forming of doped wells and the second portion is formed after forming at least one well in a bulk semiconductor process, or after the forming at least one body region in Silicon-on-Insulator (SOI) process.

In yet another embodiment, a first portion of a gate dielectric is formed, wherein heat does not affect transistor performance during the forming of the first portion. Further, a second portion of the gate dielectric is formed, wherein heat affects the transistor performance during the forming of the second portion.

In some embodiments, when more than two gate dielectric regions are formed, at least one portion of one of the gate dielectrics is formed before any heat affects the transistor performance and at least one portion is formed after the heat affects the transistor performance.

In one embodiment, after forming the gate dielectrics, conductive gate materials (the region 152) are selectively deposited as illustrated in FIG. 1J.

In some embodiments, using the sacrificial oxide as part of a gate dielectric can also be done with SOI technologies.

In one embodiment, the gate dielectric in an NVM is either ruptured or left intact to represent a logical "0" or a logical "1". As gate oxides are scaled down thinner, leakage currents increase. Current leakage due to thin gate oxides can be large and distinguishing between a "good" oxide and a "ruptured" oxide in a large array can be difficult. Thus, by thickening the gate oxide using a sac-ox reduces gate oxide leakage current of a good device (not ruptured device) allowing differentiation of ruptured vs. intact gate dielectrics.

Another problem that occurs in very thin gate oxides is soft breakdown. Soft breakdown of the gate oxide is where gate leakage significantly increases after some amount of stress, but the transistor still functions. This is different from hard breakdown since when hard breakdown occurs the transistor no longer operates (will not switch). Having two dielectric breakdown mechanisms causes the distribution of how much stress it takes to break (the hard breakdown or the soft breakdown) a gate to a very large extent. How much stress is required to break a gate oxide depends on the gate oxide quality and thickness. The SiO2 and other gate dielectrics may have some defects. The number of defects in a device may be one cause of variation in gate quality and varies from device to device. A gate with a defect may break with much less stress than a perfect gate. In large arrays of very small devices, such as an array of devices used as fuses for NVM, the variation is highest. If a second mechanism for breakdown is introduced the variation is even higher. The stress needed to rupture (hard breakdown) the best gate (gate with fewest defects) can be much larger than the stress needed to cause soft breakdown in a gate with a defect that causes the soft breakdown. An example of relationship between the soft breakdown and the hard breakdown is described in: "*Soft Breakdown of Ultra-Thin Gate Oxide Layers*" by M. Depas, T. Nigam, and M. Hayes, *IEEE Transaction on Electron Devices Vol.* 43, No. 9, September 1996 and is incorporated herein by reference in its entirety.

In large arrays of NVM cells it becomes difficult to break the device that needs to be ruptured and not damage the gates that need to remain intact. Using the sac-ox to thicken the gate dielectric can thicken the device above the threshold where soft breakdown is observed.

The gate oxide fabricated can be used in memory devices. Examples of the memory devices include but are not limited to a non-volatile memory device, a floating gate memory device and a dielectric rupture memory device.

In the present disclosure, relational terms such as first and second, and the like, have been used to distinguish one entity from another entity, without necessarily implying any actual relationship or order between such entities. Further, those skilled in the art will recognize that a wide variety of modifications, alterations, and combinations can be made with respect to the above described embodiments without departing from the scope of the disclosure, and that such modifications, alterations, and combinations are to be viewed as being within the ambit of the disclosure.

What is claimed is:

1. A method of fabricating a gate oxide of a floating gate transistor, the method comprising:
   forming a plurality of shallow trench isolation (STI) regions in a silicon wafer;
   selectively filling the STI regions with oxide;
   forming sacrificial oxide regions in the silicon wafer;
   forming implant regions in the silicon wafer;
   selectively removing the sacrificial oxide regions; and
   forming the gate oxide, wherein forming the gate oxide comprises:
      forming a gate dielectric having a first portion and a second portion, wherein implantation is performed on the first portion without a material covering the first portion, and the second portion is free of implants.

2. The method as claimed in claim 1, wherein forming the STI regions comprises:
   depositing an oxide layer;
   depositing a nitride layer;
   developing a photo resist; and
   etching the oxide layer, the nitride layer and the silicon wafer.

3. The method as claimed in claim 1, wherein selectively filling the STI regions comprises:
   removing the photo resist; and
   filling the STI regions with the oxide up to the nitride layer.

4. The method as claimed in claim 1, wherein forming the implant regions in the silicon wafer comprises:
   developing n-well regions;
   developing p-well regions;
   removing nitride; and
   selectively removing the oxide.

5. The method as claimed in claim 1 and further comprising selectively depositing a conductive gate material.

6. The method as claimed in claim 5, wherein the conductive gate material is poly silicon.

7. The method as claimed in claim 1, wherein the floating gate transistor is used in non-volatile memory device.

8. The method as claimed in claim 1 and further comprising:
preventing leakage current in the floating gate transistor.

9. The method as claimed in claim 1 and further comprising:
forming a first portion of a gate dielectric, wherein the first portion is formed prior to forming of doped wells; and
forming a second portion of the gate dielectric, wherein the second portion is formed by one of:
forming the second portion after forming at least one well in a bulk semiconductor process; and
forming the second portion after forming at least one body region in a Silicon-on-Insulator process.

10. The method as claimed in claim 1, wherein the sacrificial oxide region layer is partially selectively removed.

11. The method as claimed in claim 1 and further comprising:
forming a first portion of a gate dielectric, wherein heat does not affect transistor performance during the forming of the first portion; and
forming a second portion of the gate dielectric, wherein heat affects the transistor performance during the forming of the second portion.

12. The method as claimed in claim 1 and further comprising:
forming two or more gate dielectrics, wherein at least one portion of one of the gate dielectrics are formed before heat affects transistor performance and at least one portion is formed after the heat affects the transistor performance.

13. A method of fabricating a gate oxide in a transistor, the method comprising:
forming a plurality of shallow trench isolation (STI) regions in a silicon wafer by at least one of depositing an oxide layer, depositing a nitride layer, developing a photo resist, etching the oxide layer, etching the nitride layer, and etching the silicon wafer;
selectively filling the STI regions with oxide by at least one of removing the photo resist, and filling the STI regions with the oxide up to the nitride layer;
forming sacrificial oxide regions in the silicon wafer;
forming implant regions in the silicon wafer by at least one of developing n-well regions, developing p-well regions, removing nitride, and selectively removing the oxide;
selectively removing the sacrificial oxide regions; and
forming the gate oxide, wherein forming the gate oxide comprises:
forming a gate dielectric having a first portion and a second portion, wherein implantation is performed on the first portion without a material covering the first portion, and the second portion is free of implants.

14. The method as claimed in claim 13, wherein the transistor comprising the gate oxide is used in non-volatile memory device.

15. The method as claimed in claim 13, wherein the transistor comprising the gate oxide is used in floating gate memory device.

16. The method as claimed in claim 13, wherein the transistor comprising the gate oxide is used in dielectric rupture memory device.

17. A transistor in a non-volatile memory prepared by a process, the process comprising:
forming a plurality of shallow trench isolation (STI) regions in a silicon wafer by at least one of depositing an oxide layer, depositing a nitride layer, developing a photo resist, etching the oxide layer, etching the nitride layer, and etching the silicon wafer;
selectively filling the STI regions with oxide by at least one of removing the photo resist, and filling the STI regions with the oxide up to the nitride layer;
forming sacrificial oxide regions in the silicon wafer;
forming implant regions in the silicon wafer by at least one of developing n-well regions, developing p-well regions, removing nitride, and selectively removing the oxide;
selectively removing the sacrificial oxide regions; and
forming a gate oxide, wherein forming the gate oxide comprises:
forming a gate dielectric having a first portion and a second portion, wherein implantation is performed on the first portion without a material covering the first portion, and the second portion is free of implants.

18. The method as claimed in claim 17, wherein the transistor comprising the gate oxide is used in floating gate memory device.

19. The method as claimed in claim 17, wherein the transistor comprising the gate oxide is used in gate dielectric rupture memory device.

* * * * *